(12) United States Patent
Kramer et al.

(10) Patent No.: US 8,389,327 B2
(45) Date of Patent: Mar. 5, 2013

(54) METHOD FOR MANUFACTURING CHIPS

(75) Inventors: Torsten Kramer, Wannweil (DE); Matthias Boehringer, Reutlingen (DE); Stefan Pinter, Reutlingen (DE); Hubert Benzel, Pliezhausen (DE); Matthias Illing, Kusterdingen (DE); Frieder Haag, Wannweil (DE); Simon Armbruster, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 70 days.

(21) Appl. No.: 12/736,721

(22) PCT Filed: Dec. 2, 2008

(86) PCT No.: PCT/EP2008/066593
§ 371 (c)(1),
(2), (4) Date: Feb. 10, 2011

(87) PCT Pub. No.: WO2009/138138
PCT Pub. Date: Nov. 19, 2009

(65) Prior Publication Data
US 2011/0151620 A1 Jun. 23, 2011

(30) Foreign Application Priority Data

May 14, 2008 (DE) .......................... 10 2008 001 738

(51) Int. Cl.
*H01L 21/50* (2006.01)
(52) U.S. Cl. .................. 438/106; 438/653; 257/E21.499
(58) Field of Classification Search .......................... None
See application file for complete search history.

(56) References Cited

U.S. PATENT DOCUMENTS 5,391,257 A 2/1995 Sullivan et al.

FOREIGN PATENT DOCUMENTS

| DE | 102 46 053 | 4/2004 |
|----|------------|--------|
| DE | 103 50 036 | 5/2005 |
| WO | WO 03/083930 | 10/2003 |
| WO | WO 2007/010443 | 9/2007 |

*Primary Examiner* — Seahvosh Nikmanesh
(74) *Attorney, Agent, or Firm* — Kenyon & Kenyon LLP

(57) ABSTRACT

A method for manufacturing chips (1, 2), in which at least one diaphragm (11, 12) is produced in the surface layer of a semiconductor substrate (10) spanning a cavity (13). The functionality of the chip (1, 2) is then integrated into the diaphragm (11, 12). In order to separate the chip (1, 2), the diaphragm (11, 12) is detached from the substrate composite. The method according to the present invention is characterized by metal plating of the back of the chip (1, 2) in an electroplating process before the chip is separated.

21 Claims, 8 Drawing Sheets

(D-D)

(B-B)

(A-A)

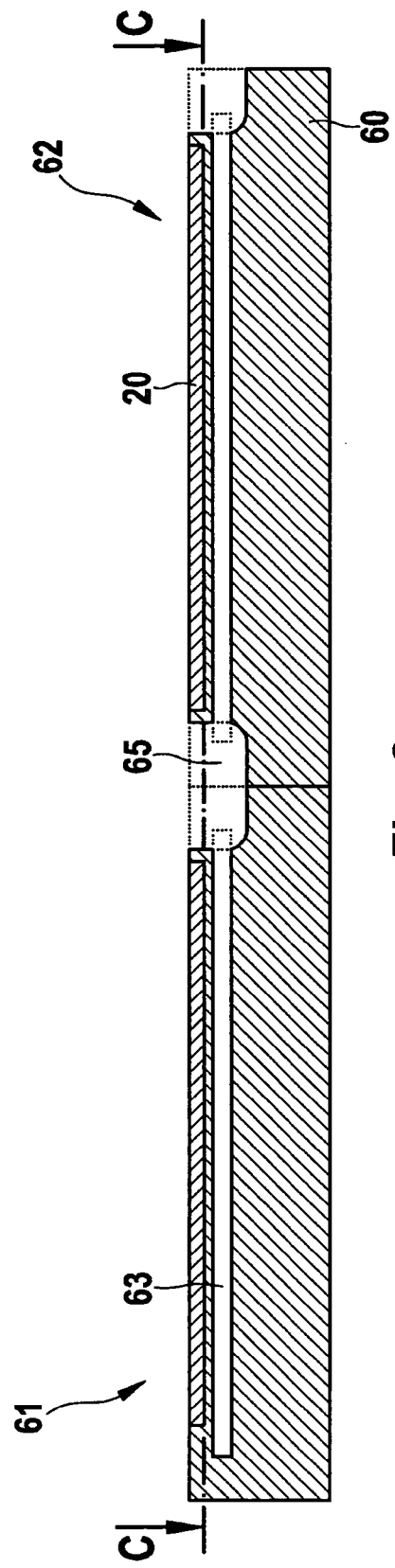

(C-C)

METHOD FOR MANUFACTURING CHIPS

BACKGROUND OF THE INVENTION

1. Field of the Invention

The present invention relates to a method for manufacturing chips on the basis of a semiconductor substrate, in which at least one diaphragm is produced in the surface layer of the substrate, spanning a cavity, in which the functionality of the chip is integrated into the diaphragm, and in which the diaphragm is detached from the substrate composite in order to separate the chip.

2. Description of Related Art

Such a method for manufacturing and separating semiconductor chips is described in published German patent application document DE 103 50 036 A1. The known method provides for diaphragm areas to be produced in the surface of a semiconductor substrate, making use of surface micromechanical processes, each diaphragm area spanning a cavity and being joined to the substrate lying below it only via support points. The surface of the semiconductor substrate is then further processed in order to implement the desired chip functionality on the individual diaphragm areas. The chips are separated in two steps. In the first step the chips are detached at their sides from the composite. For that purpose, etched trenches running into the cavities below the diaphragm areas are produced. Not until the second step are the chips detached from the substrate lying below them, by the support points being snapped off in a mechanical pick-and-place step. In contrast to a sawing process, in this case the chips are thus separated not serially but in parallel, without any action of water and without contaminating particles occurring which could settle in the structure of the chip. The method known from published German patent application document DE 103 50 036 is thus also suitable for manufacturing very thin chips of any desired shape.

SUMMARY OF THE INVENTION

On the basis of the method known from published German patent application document DE 103 50 036, the present invention proposes a simple way of metal plating the back of chips.

According to the present invention, the back of the chip is metal plated in an electroplating process before the chip is detached from the chip composite.

The present invention recognizes that electroplating processes may also be used in chip manufacture in order to metal plate surfaces, these processes being particularly suitable for coating structured surfaces. Fully utilized is the fact that in electroplating processes metal is deposited basically on all conductive surfaces, and consequently also on the semiconductor materials used in micromechanics.

The method according to the present invention demonstrates advantages in several respects by comparison with the metal plating processes generally used in chip technology, such as sputtering. For example, in order to bring about the metal plating of the back, the suggested electroplating process does not require any complicated treatment of the front of already detached chips. Rather, the semiconductor substrate is simply immersed in a suitable electroplating bath, after the chip functionality has been processed in the diaphragm areas of the substrate surface, but before the chips are separated. In that process, the electroplating solution penetrates through suitable access openings into the cavities below the chips. Since the cavities are formed in a semiconductor substrate, the cavity walls and thereby also the bottom side of the diaphragm or the back of the chip form a conductive surface, on which metal is deposited.

In consideration of the fact that chips generally also incorporate electrical switching elements, in a preferred variant of the method according to the present invention a currentless or chemical electroplating process is used. It is thereby advantageously possible to create nickel/gold surfaces or nickel/palladium/gold surfaces which have very good adhesion characteristics on the semiconductor materials habitually used and which are very resistant to pressure.

In an advantageous variant of the method according to the present invention, prior to the electroplating process a diffusion barrier layer is produced on the back of the chip, in order to prevent the semiconductor substrate and in particular the back of the chip from receiving an undesired doping during the electroplating process. Suitable materials for such a diffusion barrier are, for example, Cr, Ti, or also Ti/TiN. These materials may be simply deposited on the structured surface of the semiconductor substrate, using a chemical vapor deposition method, in the course of which the walls of the cavity and thereby also the back of the chip are also coated. As a general rule, the diffusion barrier layer is then structured. Here, the diffusion barrier layer may, for example, be completely removed from the chip surface with the aid of simple directed back-sputtering, while remaining in place on the walls of the cavity under the diaphragm and thereby also on the back of the chip.

Since in the electroplating process used according to the present invention not only the backs of the chips are metal plated, but also all freely accessible conductive surfaces, the top face of the chip must be provided with a suitable passivation layer before the electroplating process, if it is intended that it should be metal plated not at all or only in certain areas.

Fundamentally, the diaphragm acting as the base material for the chip may be produced in the substrate surface by any desired method, thus also by bulk micromechanical processes, working from the back of the substrate. In particular for manufacturing very thin chips, however, it is preferable for the diaphragm to be produced using surface micromechanical processes. When proceeding in this way, use is made of semiconductor processes, such as, for example, epitaxy, using which monocrystalline chips of a predefined thickness may reliably be implemented.

If the diaphragm has been produced using surface micromechanical processes, then the access to the cavity under the diaphragm required for the electroplating process according to the present invention is also advantageously produced starting from the front of the substrate, with the diaphragm being opened up at the edge of the chip. This structuring of the front of the substrate is advantageously performed as part of the separation stage.

In particular when manufacturing thin chips, it is advantageous to provide at least one support point when producing the diaphragm over the cavity, with the diaphragm being joined to the bottom of the cavity by this support point. A suitable arrangement of one or more such support points prevents any flexing of the diaphragm, which would have a negative effect during the subsequent processing of the chips, in particular where lithography is used. In addition, such support points prevent the diaphragm from being distorted by layers which are subsequently applied as part of the chip processing. This ensures that in the subsequent electroplating process an even metal plating of the back of the chip is achieved.

BRIEF DESCRIPTION OF THE DRAWINGS

The invention will now be described further in the following description of two exemplary embodiments of the present invention, with reference to the drawings.

FIG. 1b shows a corresponding top view of this first semiconductor substrate along line A-A shown in FIG. 1a.

FIG. 6a schematically shows a cross-sectional representation through a second semiconductor substrate along line D-D shown in FIG. 6b, after diaphragm areas have been produced in the substrate surface and after a trenching process to separate the chips.

DETAILED DESCRIPTION OF THE INVENTION

Figure 1A:
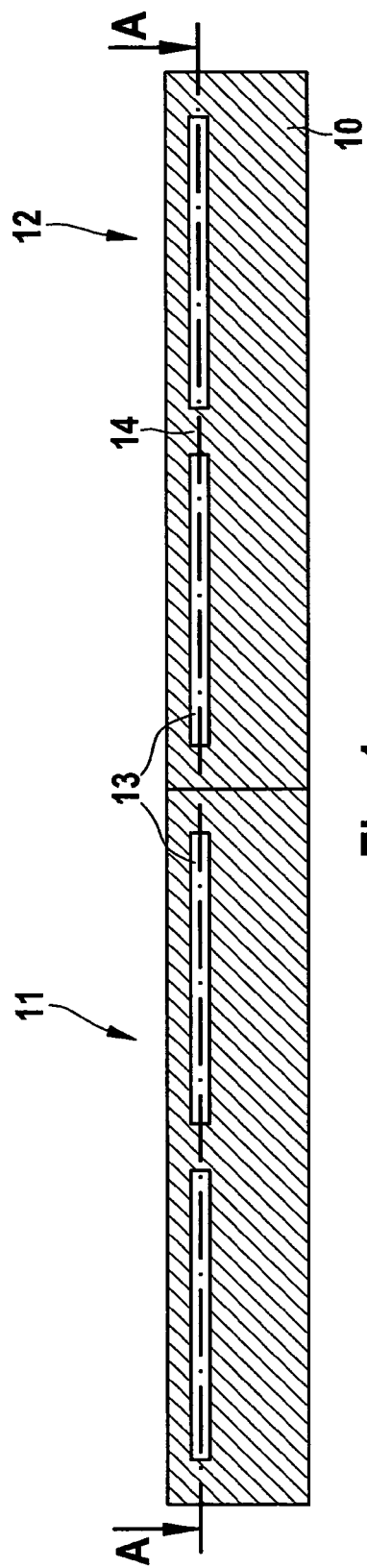
FIG. 1a schematically shows a cross-sectional representation through a first semiconductor substrate along line B-B shown in FIG. 1b, after diaphragm areas have been produced in the substrate surface.
Figure 1B:
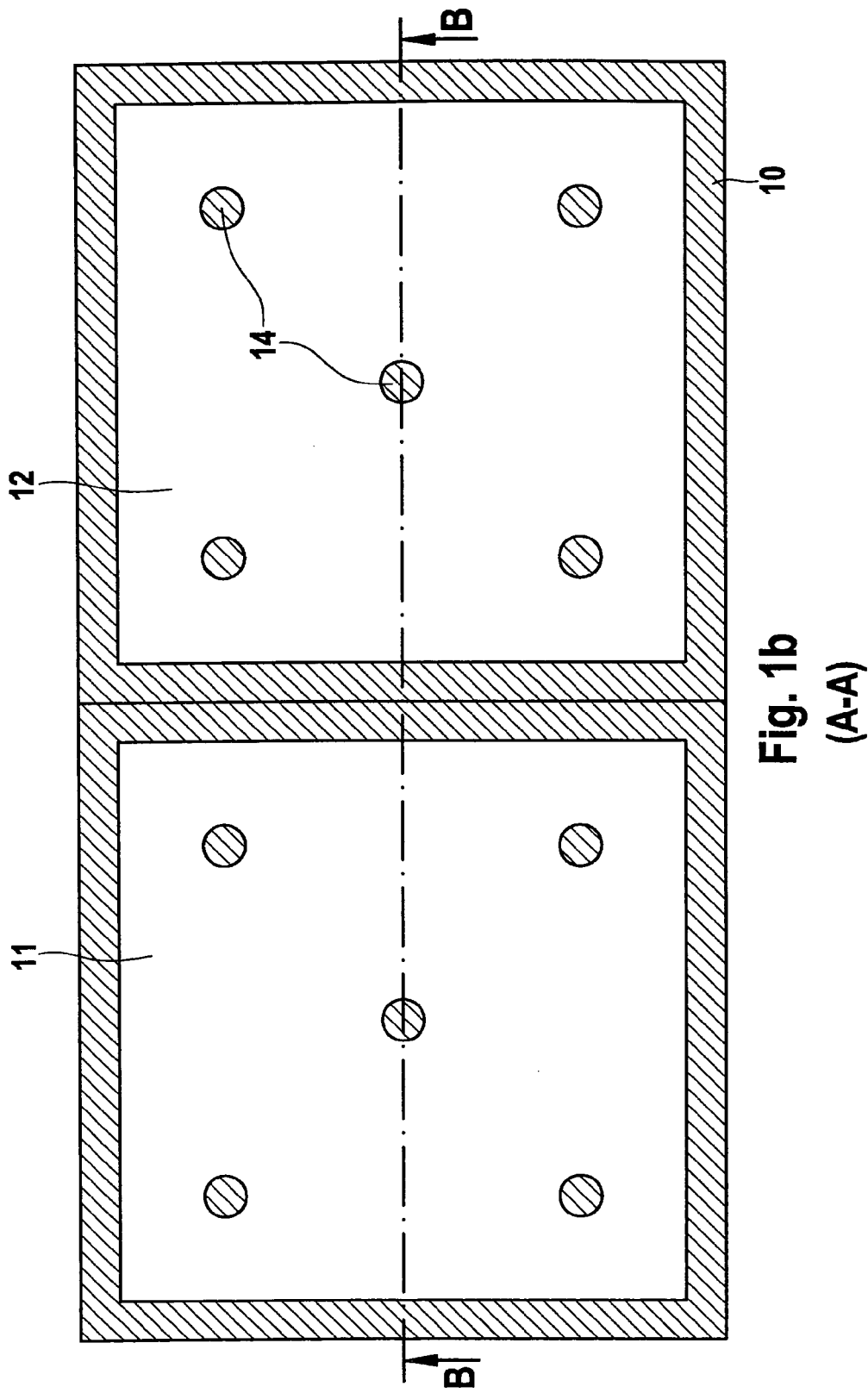

FIGS. 1a and 1b show a semiconductor substrate 10, in whose surface layer diaphragm areas 11 and 12 have been produced, using surface micromechanical processes. Each diaphragm area 11, 12 spans a cavity 13 and is joined to the bottom of the cavity by five support points 14, as is made clear in particular by the cross-sectional representation in FIG. 1a, while FIG. 1b shows the arrangement of support points 14 in diaphragm areas 11, 12. Support points 14 support and stabilize diaphragm areas 11, 12. They ensure that diaphragm areas 11, 12 are sufficiently flat during the subsequent semiconductor processing, in which the functionality of a chip is integrated into diaphragm areas 11, 12. Any shape, number and position of support points may be selected and it will be advantageous if they are matched to the size and shape of the diaphragm areas. However, the column diameter, or the "wall thickness" if "support walls" are used, should at most be on the order of magnitude of the thickness of the diaphragm.

Figure 2:
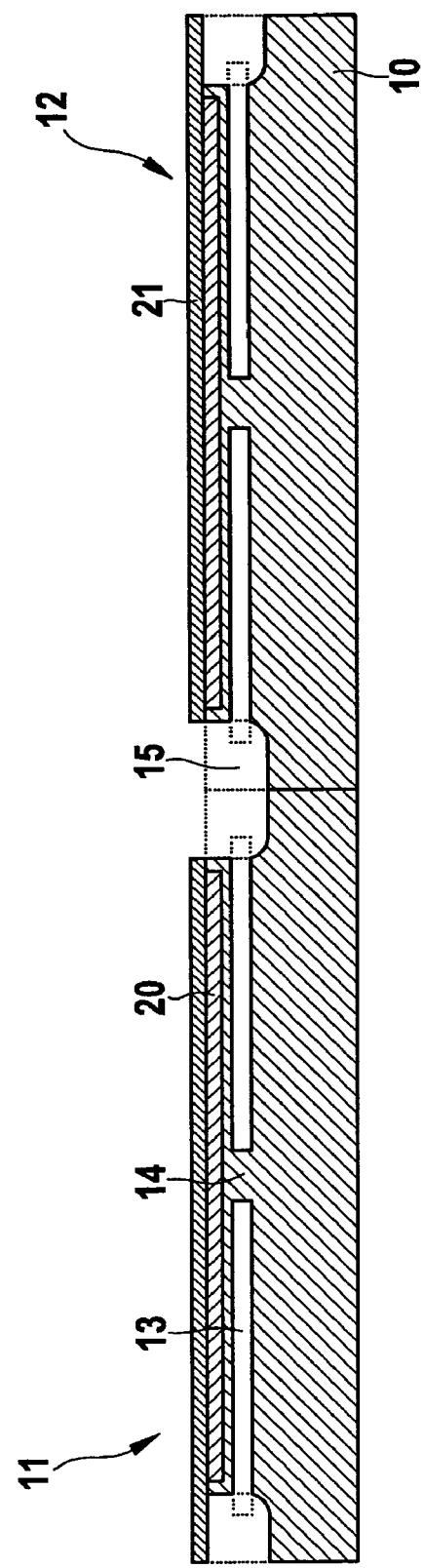
FIG. 2 schematically shows a cross-sectional representation of the first semiconductor substrate after a trenching process to separate the chips.

The exemplary embodiment described here relates to the manufacturing of very thin chips. To that end a semiconductor circuit 20 having tracks and bond pads is diffused directly into the substrate surface of diaphragm areas 11, 12 and protected using a passivation layer 21. For purposes of separating chips 1, 2 manufactured in this way, diaphragm areas 11, 12 are first detached at their sides from the composite, as shown in FIG. 2. To that end etched trenches 15 are produced at the edge of diaphragm areas 11, 12, such trenches running into cavities 13 below diaphragm areas 11, 12 and thus forming access openings to cavities 13. After that stage the individual chips 1, 2 are still joined to substrate 10 only through support points 14. In principle, a different method may also be used for detaching chips 1, 2 at their sides, but a trenching process makes it simple to produce chips of the most varied shapes, including hexagonal or round.

The mask used in this trenching stage to separate the chips covers the entire area of the chip, including the metal bond pads. If the mask were to be removed, in the subsequent currentless electroplating step a galvanic deposit would also be applied to the metal bond pads. If the mask is left on the chips, no metal is deposited on the bond pads.

Figure 3:
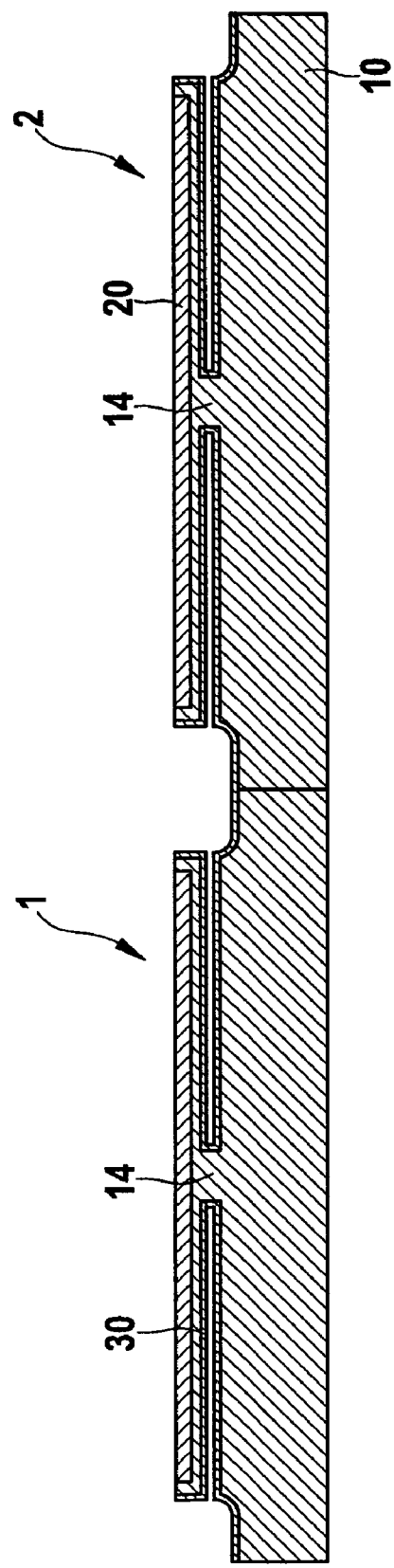
FIG. 3 schematically shows a cross-sectional representation of the first semiconductor substrate after the electroplating process according to the present invention.

The entire semiconductor substrate 10 now undergoes a currentless electroplating process, with all freely accessible electrically conductive surfaces being metal plated. Before electroplating, a diffusion barrier may be deposited and structured. Accordingly, a metal plated layer 30 is formed also on the side walls of etched trenches 15 and on the cavity walls and thus also on the back and edges of the chips, as shown in FIG. 3.

Figure 4:
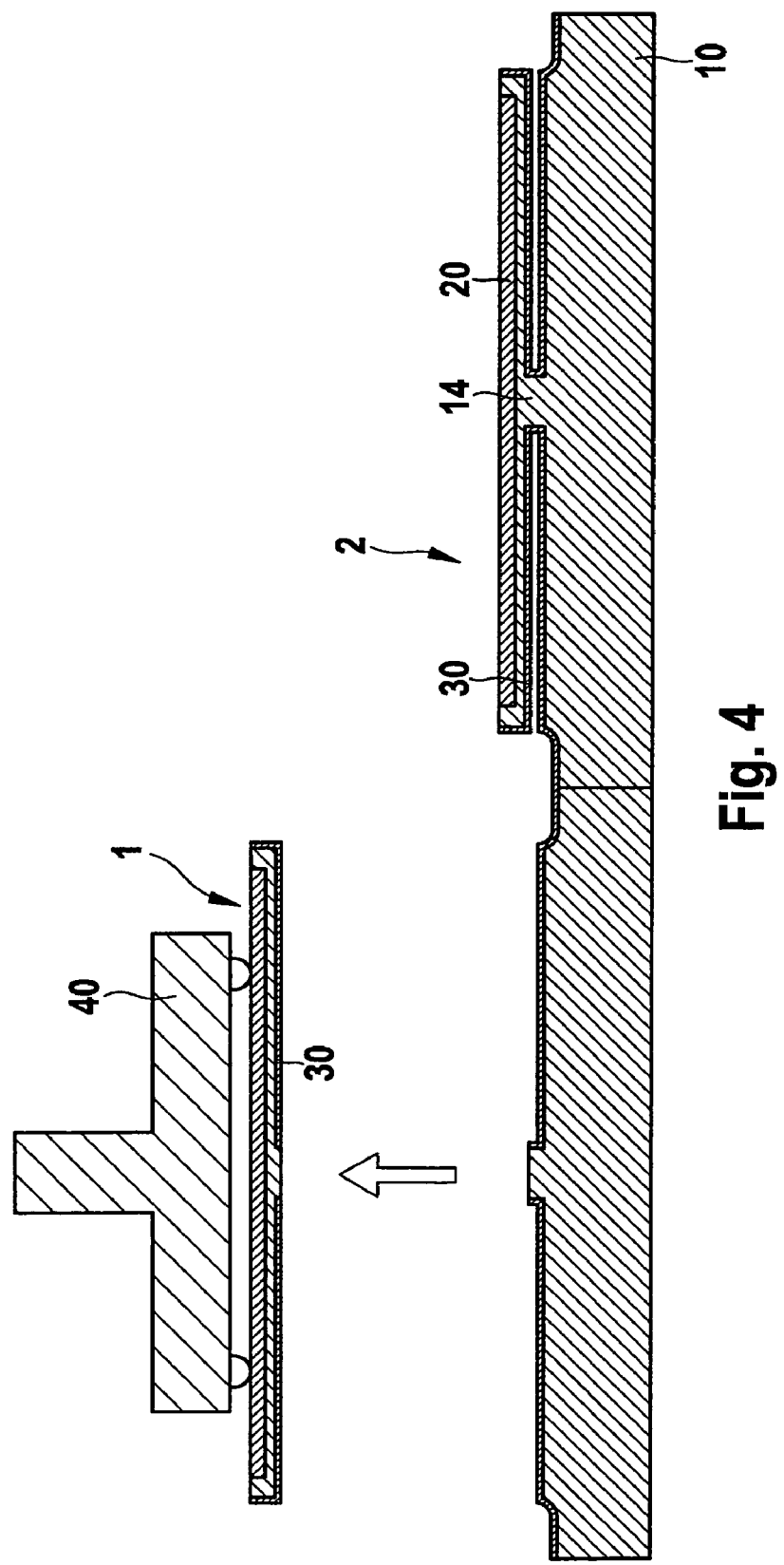
FIG. 4 schematically shows a cross-sectional representation of the first semiconductor substrate after one chip has been separated.

Only after that stage are the individual chips 1, 2 removed from substrate 10 with the aid of a tool 40, as shown in FIG. 4. The snapping off of support points 14 may be improved by an oscillatory motion of tool 40, such as, for example, through ultrasound vibrations in the x, y, or z axis or through torsional vibrations.

Figure 5:
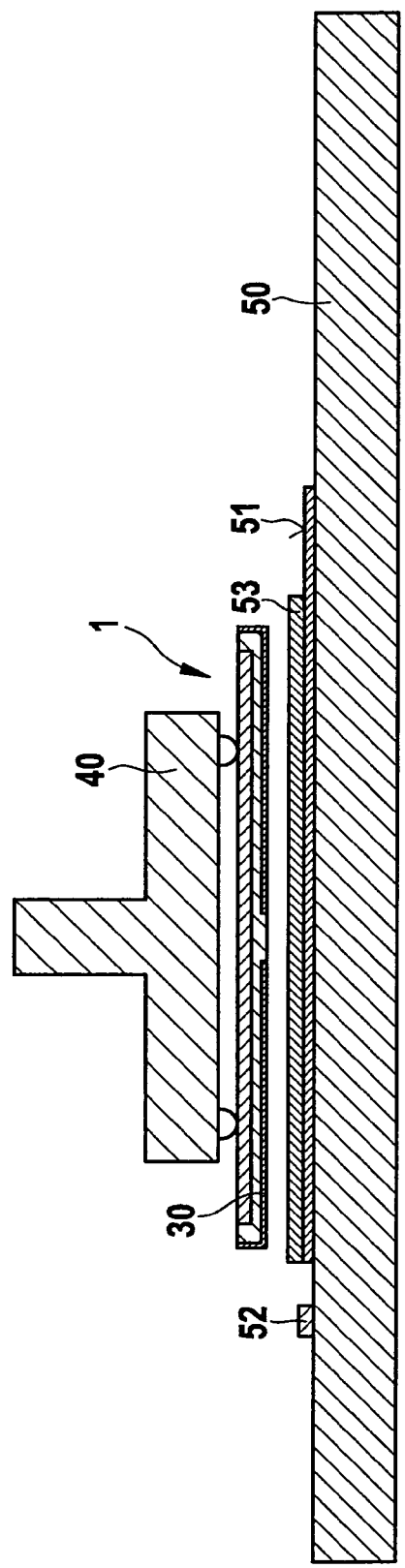
FIG. 5 schematically shows a cross-sectional representation of a chip separated in that way being placed upon a substrate.

FIG. 5 shows how a chip 1 thus separated and with its back metal plated is applied to a substrate 50 with the aid of tool 40. This substrate 50, which might be, for example, a ceramic or liquid crystal polymer board, has a structured metal plating in which, on the one hand, a mounting surface 51 for chip 1 and on the other hand, also conductive tracks 52 are formed. Chip 1 is installed on mounting surface 51 with the aid of a soldering process, such as reflow soldering, and thus firmly attached to substrate 50. Metal plating 30 of the back, the connecting layer of solder 53 produced during the soldering process, and metal plating 51 of the mounting surface together guarantee an excellent thermal contact of chip 1 with substrate 50. Substrate 50 may thus also act as a heat sink. For that purpose it is advantageous if substrate 50 is made of a material having good heat conducting characteristics. For better heat dissipation the substrate may also be cooled.

Figure 6B:
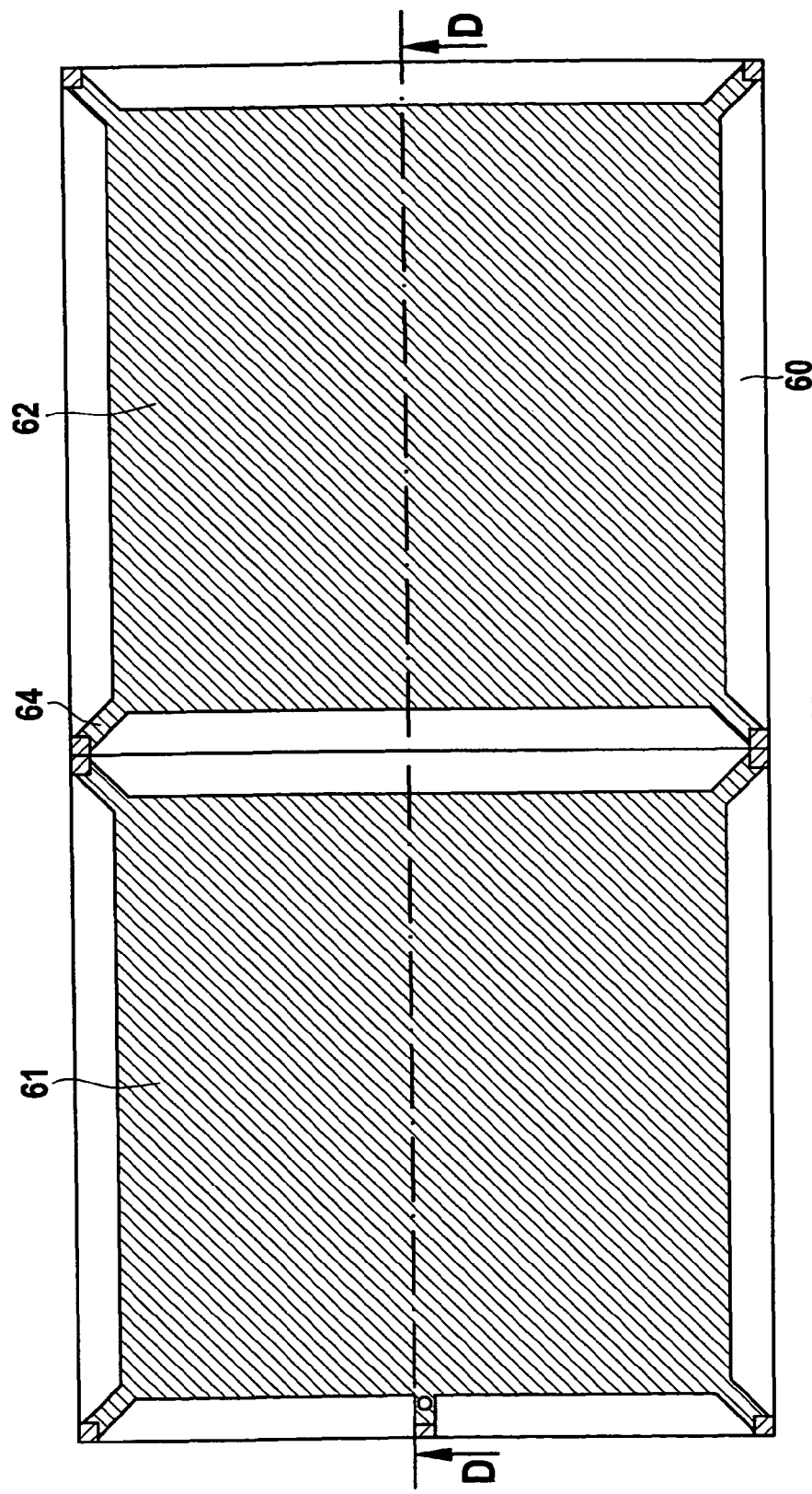
FIG. 6b shows a corresponding top view of this second semiconductor substrate along line C-C shown in FIG. 6

FIGS. 6a and 6b show a semiconductor substrate 60 in whose surface layer square diaphragm areas 61 and 62 have been produced also using surface micromechanical processes, with each diaphragm area spanning a cavity 63. Following that, the desired chip functionality is produced into diaphragm areas 61, 62. Only then are chips 1, 2 detached at their sides from the composite by a trenching process. In the exemplary embodiment shown here, however, lateral webs 64 remain which are formed at the diaphragm corners but may also be situated along the edges, preferably halfway along the edge. Chips 1 and 2 are still joined to substrate 60 with the aid of these webs 64 even after the trenching process. Then the metal plating of the back of the chip takes place using an electroplating process, during which the electroplating solution penetrates through etched trenches 65 into cavities 63. Only after that are chips 1, 2 detached from substrate 60 in a mechanical picking process in which webs 64 are snapped off. In order to simplify the picking process, webs 64 may also be formed with a predetermined breaking point, for example in the form of a perforation.

The method according to the present invention permits the manufacture of very thin chips having a metal plated back for better heat dissipation and of a thickness that may be stipulated between 1 μm and 100 μm. The metal plated back of these very thin chips makes it possible to solder the chips, enabling them to be easily joined thermally to a substrate. This type of very thin chips may be advantageously utilized as high- and medium-pressure sensors, on a steel base using a diaphragm. In such a case the high coefficient of thermal expansion of steel is imposed on the thin semiconductor chip, which as a general rule has a significantly lower coefficient of thermal expansion. Since the chip is very thin, in the event of temperature changes it may elastically deform without being permanently damaged or without permanently damaging the attachment layer. Using this type of thin chip, force, torsion, or torque sensors, in addition to pressure sensors, may be manufactured using which, for example, the mechanical stress in any type of steel component may be measured.

In addition, using the method according to the present invention makes it simple to implement any desired shape of chip. Separation in this case takes place without any action of water and without particles occurring, as is the case in a sawing process. Finally, the semiconductor substrate which acts as the base material for the method according to the present invention may also be reused if the metal layer resulting from the electroplating process is removed.

What is claimed is:

1. A method for manufacturing chips based on a semiconductor substrate, comprising:
    producing at least one diaphragm spanning a cavity in a surface layer of the substrate,
    integrating the functionality of the chip into the diaphragm, and
    detaching the diaphragm from the substrate composite in order to separate the chip,
    wherein a back of the chip is metal plated in an electroplating process before the chip is detached from the substrate composite.

2. The method as recited in claim 1, wherein the back of the chip is metal plated in a currentless electroplating process.

3. The method as recited in claim 1, wherein a nickel/gold layer or a nickel/palladium/gold layer is produced on the back of the chip.

4. The method as recited in claim 2, wherein a nickel/gold layer or a nickel/palladium/gold layer is produced on the back of the chip.

5. The method as recited in claim 1, wherein before the electroplating process a diffusion barrier layer is deposited on the back of the chip.

6. The method as recited in claim 2, wherein before the electroplating process a diffusion barrier layer is deposited on the back of the chip.

7. The method as recited in claim 3, wherein before the electroplating process a diffusion barrier layer is deposited on the back of the chip.

8. The method as recited in claim 5, wherein the diffusion barrier layer is produced by a chemical vapor deposition method and is structured on a front of the chip.

9. The method as recited in claim 6, wherein the diffusion barrier layer is produced by a chemical vapor deposition method and is structured on a front of the chip.

10. The method as recited in claim 7, wherein the diffusion barrier layer is produced by a chemical vapor deposition method and is structured on a front of the chip.

11. The method as recited in claim 5, wherein a Cr, Ti, or Ti/TiN layer is used as the diffusion barrier layer.

12. The method as recited in claim 8, wherein a Cr, Ti, or Ti/TiN layer is used as the diffusion barrier layer.

13. The method as recited in claim 1, wherein a top face of the chip is provided with a passivating layer prior to the electroplating process.

14. The method as recited in claim 2, wherein a top face of the chip is provided with a passivating layer prior to the electroplating process.

15. The method as recited in claim 3, wherein a top face of the chip is provided with a passivating layer prior to the electroplating process.

16. The method as recited in claim 5, wherein a top face of the chip is provided with a passivating layer prior to the electroplating process.

17. The method as recited in claim 1, wherein the diaphragm is produced using a surface micromechanical process.

18. The method as recited in claim 2, wherein the diaphragm is produced using a surface micromechanical process.

19. The method as recited in claim 3, wherein the diaphragm is produced using a surface micromechanical process.

20. The method as recited in claim 17, wherein the diaphragm is opened at its edge, in order to provide access to the cavity below the diaphragm and to the back of the chip.

21. The method as recited in claim 17, wherein when the diaphragm is produced, at least one support point is formed above the cavity, through which the diaphragm is joined to the bottom of the cavity.

* * * * *

UNITED STATES PATENT AND TRADEMARK OFFICE
CERTIFICATE OF CORRECTION

PATENT NO.       : 8,389,327 B2                                              Page 1 of 1
APPLICATION NO.  : 12/736721
DATED            : March 5, 2013
INVENTOR(S)      : Kramer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 156 days.

Signed and Sealed this
First Day of September, 2015

Michelle K. Lee
*Director of the United States Patent and Trademark Office*